United States Patent
Yasuda et al.

(10) Patent No.: US 8,390,201 B2
(45) Date of Patent: Mar. 5, 2013

(54) MULTI-COLUMN ELECTRON BEAM EXPOSURE APPARATUS AND MAGNETIC FIELD GENERATION DEVICE

(75) Inventors: Hiroshi Yasuda, Tokyo (JP); Yoshihisa Ooae, Tokyo (JP); Takeshi Haraguchi, Tokyo (JP)

(73) Assignee: Advantest Corp., Tokyo (JP)

( * ) Notice: Subject to any disclaimer, the term of this patent is extended or adjusted under 35 U.S.C. 154(b) by 131 days.

(21) Appl. No.: 12/928,899

(22) Filed: Dec. 22, 2010

(65) Prior Publication Data
US 2011/0148297 A1 Jun. 23, 2011

Related U.S. Application Data

(63) Continuation of application No. PCT/JP2008/061431, filed on Jun. 24, 2008.

(51) Int. Cl.
*H01J 25/50* (2006.01)
(52) U.S. Cl. ......... 315/39.71; 315/236; 315/267
(58) Field of Classification Search ......... 315/501, 315/111.41, 39.71, 236, 267, 338, 343–348; 335/209–306
See application file for complete search history.

(56) References Cited

U.S. PATENT DOCUMENTS

| | | | |
|---|---|---|---|
| 2,503,173 A | 4/1950 | Reisner | |
| 4,806,766 A * | 2/1989 | Chisholm | 250/396 ML |
| 6,373,153 B1 * | 4/2002 | Hazelton et al. | 310/12.06 |
| 6,823,142 B1 * | 11/2004 | Tanaka et al. | 398/152 |
| 7,067,820 B2 * | 6/2006 | Buijsse | 250/396 ML |
| 2002/0036367 A1 * | 3/2002 | Walmer et al. | 264/427 |
| 2003/0183773 A1 | 10/2003 | Haraguchi | |
| 2005/0104013 A1 * | 5/2005 | Stengl et al. | 250/492.21 |

FOREIGN PATENT DOCUMENTS

| | | |
|---|---|---|
| EP | 0251381 | 1/1988 |
| JP | 36-6580 | 6/1961 |
| JP | 51-122373 | 10/1976 |
| JP | 52-100195 | 8/1977 |
| JP | 55-143761 | 11/1980 |
| JP | 59-014242 | 1/1984 |
| JP | 63-6736 | 1/1988 |
| JP | 64-076654 | 3/1989 |
| JP | 01-166450 | 6/1989 |
| JP | 2004-88071 | 3/2004 |
| JP | 2005-129944 | 5/2005 |
| WO | WO 2006/018840 | 2/2006 |

* cited by examiner

*Primary Examiner* — Jimmy Vu
*Assistant Examiner* — Henry Luong
(74) *Attorney, Agent, or Firm* — Muramatsu & Associates

(57) ABSTRACT

A multi-column electron beam exposure apparatus includes: multiple column cells; an electron beam converging unit in which two annular permanent magnets and electromagnetic coils are surrounded by a ferromagnetic frame, the two annular permanent magnets being magnetized in an optical axis direction and symmetrical about the optical axis, where the electromagnetic coils adjust magnetic fields of the annular permanent magnets; and a substrate provided with circular apertures through which electron beams used in the column cells pass, respectively, where the electron beam converging unit is disposed in each of the circular apertures. The two annular permanent magnets may be disposed one above the other in the optical axis direction, and the electromagnetic coils may be provided inside or outside the annular permanent magnets in their radial direction.

4 Claims, 9 Drawing Sheets

MULTI-COLUMN ELECTRON BEAM EXPOSURE APPARATUS AND MAGNETIC FIELD GENERATION DEVICE

CROSS-REFERENCE TO RELATED APPLICATIONS

This application is a continuation of prior International Patent Application No. PCT/JP2008/061431, filed Jun. 24, 2008, the entire contents of which are incorporated herein by reference.

BACKGROUND OF THE INVENTION

1. Field of the Invention

The present invention relates to a multi-column electron beam exposure apparatus and a magnetic field generation device, and particularly relates to a multi-column electron beam exposure apparatus and a magnetic field generation device which are capable of generating a strong magnetic field in a small space so that the intervals between column cells can be made small.

2. Description of the Related Art

For the purpose of improving throughput, an electron beam exposure apparatus is provided with a variable rectangular aperture or multiple stencil mask patterns (character projection (CP)) in a stencil mask, and transfers a desired pattern onto a wafer through exposure by selectively using the aperture or patterns with beam deflection.

As an example of such electron beam exposure apparatuses, Japanese Laid-Open Patent Publication No. 2004-88071 discloses an electron beam exposure apparatus for character projection lithography. In the character projection lithography, one pattern region of, for example, 20×20 μm is selected through beam deflection from a mask where multiple (e.g., 100) stencil patterns are arranged, and irradiated with a beam so that the beam can be formed to have a cross section in the shape of the stencil pattern. Further, the beam having passed through the mask is deflected back by a downstream deflector and reduced in size at a given reduction rate determined by the electron optical system (e.g., 1/10). The shape of the stencil pattern is then transferred onto a sample. If the stencil patterns in the mask are prepared as appropriate in accordance with the device pattern for exposure, the number of required exposure shots is reduced greatly and the throughput is improved, as compared to the case of using only a variable rectangular aperture.

There has also been proposed a multi-column electron beam exposure apparatus which includes multiple small-sized columns (referred to as "column cells" below) of such exposure apparatuses and performs exposure processing in parallel using the multiple column cells arranged above a wafer. Each of the column cells is equivalent to a column of a single-column electron beam exposure apparatus. Since the multi-column electron beam exposure apparatus performs the exposure processing by multiple column cells in parallel, exposure throughput of the multi-column electron beam exposure apparatus as a whole can be multiplied by the number of columns.

However, use of the multiple column cells as above entails involves the following limitations. The size of the character projection mask usable in the multi-column method is restricted to 150 mm$^2$ or smaller due to the nature of the manufacturing thereof. Also, the mask of such a large size as around 300 mm$^2$ is unacceptable in consideration of the handling and storing of CP masks and wafers. Thus, the multiple column cells need to be arranged within a region of 150 mm$^2$ or smaller. In this case, the pitch of the column cells is 50 mm, 30 mm, 25 mm or the like, which is a result of division of 150 mm by a certain integer. For this reason, coils used in the electromagnetic lenses for converging electron beams need to be reduced in size. Measures, such as using coil wires of smaller diameters, may be employed to reduce the sizes of the coils. However, such measures may increase the amounts of heat generated by the coils, and possibly break the coils.

SUMMARY OF THE INVENTION

The present invention has been made in view of the above problem, and aims to provide a multi-column electron beam exposure apparatus and a magnetic field generation device which are capable of generating a strong magnetic field in a small space so that the intervals between column cells can be made small.

According to an aspect of the present invention, a multi-column electron beam exposure apparatus includes: multiple column cells; an electron beam converging unit in which two annular permanent magnets and an electromagnetic coil are surrounded by a ferromagnetic frame, each of the two annular permanent magnets being magnetized in a direction of an optical axis and being symmetrical about the optical axis, the electromagnetic coil being disposed near the annular permanent magnets and used to adjust a magnetic field of the annular permanent magnets; and a substrate provided with circular apertures through which electron beams used in the column cells pass, respectively, the substrate having the electron beam converging unit disposed in a side portion of each of the circular apertures.

In the multi-column electron beam exposure apparatus according to this aspect, the two annular permanent magnets may be disposed one above the other in the direction of the optical axis with same polarities facing each other, and the electromagnetic coil may be provided inside or outside the annular permanent magnets in a radial direction thereof. Also, the two annular permanent magnets may be disposed one above the other in the direction of the optical axis with the electromagnetic coil interposed therebetween, and polarities of the annular permanent magnets may be oriented in a same direction.

Further, in the multi-column electron beam exposure apparatus according to this aspect, each of the annular permanent magnets may be any one of a neodymium magnet and a samarium-cobalt magnet, and the ferromagnetic frame may be made of pure iron. Moreover, strength of the magnetic field of the annular permanent magnets may be within a range from 5% lower to 5% higher than required magnetic field strength.

The multi-column electron beam exposure apparatus of the present invention uses permanent magnets for the generation of magnetic fields to converge an electron beam in each column cell. As permanent magnets having magnetic field strength high enough to converge the electron beam, a neodymium magnet is used, for example. Use of such a permanent magnet allows reduction in the size of the magnetic field generation unit, whereby the intervals between the column cells can be reduced to 25 mm or smaller, for example. As a result, many column cells can be used within an area of 150 mm$^2$ or smaller, and the throughput can be improved.

In addition, each permanent magnet is surrounded by the frame made of a ferromagnetic material such as pure iron. This makes it possible to prevent one column cell from affecting the magnetic fields of the lenses in other adjacent column cells. Accordingly, the accuracy of the exposure by each column cell can be secured.

Since the magnetic field strength of the permanent magnet is constant and therefore fine adjustment of the magnetic field strength cannot be made for the adjustment of the focal point. In this regard, the electromagnetic coil is provided near each permanent magnet to cause interference between its magnetic field and that of the permanent magnet. Accordingly, the magnetic field strength of the permanent magnet is adjusted.

Further, the problem mentioned above is solved by a magnetic field generation device including: two annular permanent magnets magnetized in a direction perpendicular to a radial direction thereof and disposed one above the other; an electromagnetic coil disposed near the annular permanent magnets and used to adjust a magnetic field of the annular permanent magnets; and a ferromagnetic frame surrounding the annular permanent magnets and the electromagnetic coil.

In the magnetic field generation device according to this aspect, the annular permanent magnets may be disposed with same polarities facing each other, and the electromagnetic coil may be provided inside or outside the annular permanent magnets in a radial direction thereof. Also, the electromagnetic coil may be disposed between the annular permanent magnets, and polarities of the annular permanent magnets may be oriented in a same direction. Also, each of the annular permanent magnets may be any one of a neodymium magnet and a samarium-cobalt magnet, and the ferromagnetic frame may be made of pure iron. Also, strength of the magnetic field of the annular permanent magnets may be within a range from 5% lower to 5% higher than required magnetic field strength.

In the magnetic field generation device of the present invention, magnetic fields are generated by using rare-earth permanent magnets such as neodymium magnets or samarium-cobalt magnets. These permanent magnets are configured by two annular permanent magnets magnetized in a direction perpendicular to the radial direction thereof to generate magnetic fields. In particular, by disposing the permanent magnets with their magnetization directions opposite to each other, the magnetic field strength increases, whereby a strong magnetic field can be generated in a small space.

In addition, each permanent magnet is surrounded by the frame made of a ferromagnetic material such as pure iron. This makes it possible to prevent a generated magnetic field from leaking to the outside. Moreover, an electromagnetic coil is provided near each permanent magnet, and therefore, the magnetic field strength of the permanent magnet can be adjusted by use of the magnetic field of the electromagnetic coil.

DESCRIPTION OF THE PREFERRED EMBODIMENTS

Figure 1:
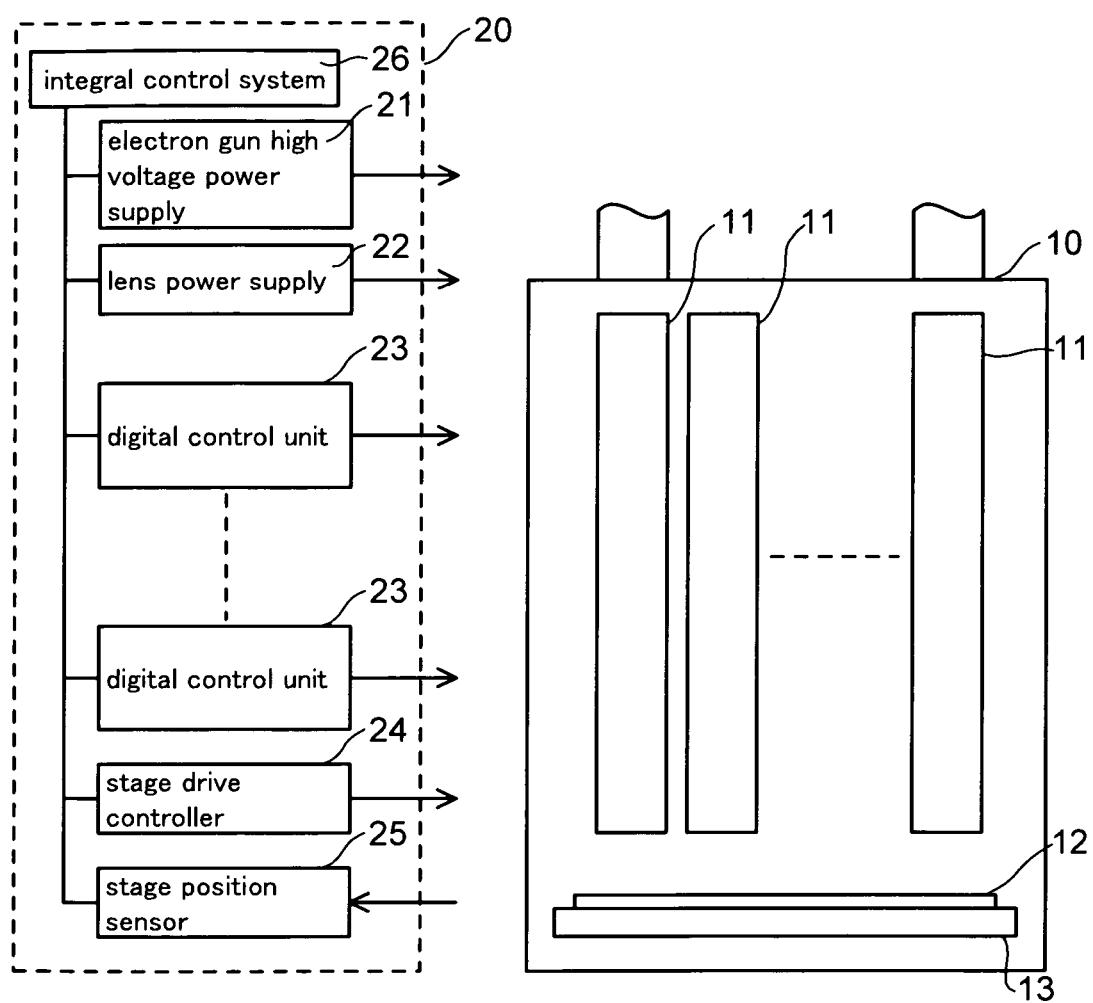
FIG. 1 is a configuration diagram of a multi-column electron beam exposure apparatus according to the present invention.

Hereinbelow, embodiments of the present invention will be described by referring to the drawings.

Configuration of Electron Beam Exposure Apparatus

FIG. 1 is a schematic configuration diagram of a multi-column electron beam exposure apparatus according to an embodiment. The multi-column electron beam exposure apparatus is broadly divided into an electron beam column 10 and a controller 20 to control the electron beam column 10. The entire electron beam column 10 is formed of multiple but equivalent column cells 11, for example, 16 column cells. All the column cells 11 are designed as identical units, which will be described later. Below the column cells 11, a wafer stage 13 is disposed with a wafer 12 of for example a 300-mm diameter mounted thereon.

On the other hand, the controller 20 includes an electron gun high voltage power supply 21, a lens power supply 22, digital control units 23, a stage drive controller 24, and a stage position sensor 25. The electron gun high voltage power supply 21 supplies power to drive an electron gun of each column cell 11 in the electron beam column 10. The lens power supply 22 supplies power to drive electromagnetic lenses of each column cell 11 in the electron beam column 10. The digital control units 23 are electric circuits which control the deflection outputs of deflectors in the column cells 11, and output high-speed deflection outputs or the like. The number of digital control units 23 is prepared corresponding to the number of column cells 11.

The stage drive controller 24 moves the wafer stage 13 on the basis of positional information given by the stage position sensor 25 so that a desired position of the wafer 12 can be irradiated with electron beams. The above components 21 to 25 are controlled collectively by an integrated control system 26 such as a workstation.

In the above multi-column electron beam exposure apparatus, all the column cells 11 are designed as identical column units.

Figure 2:
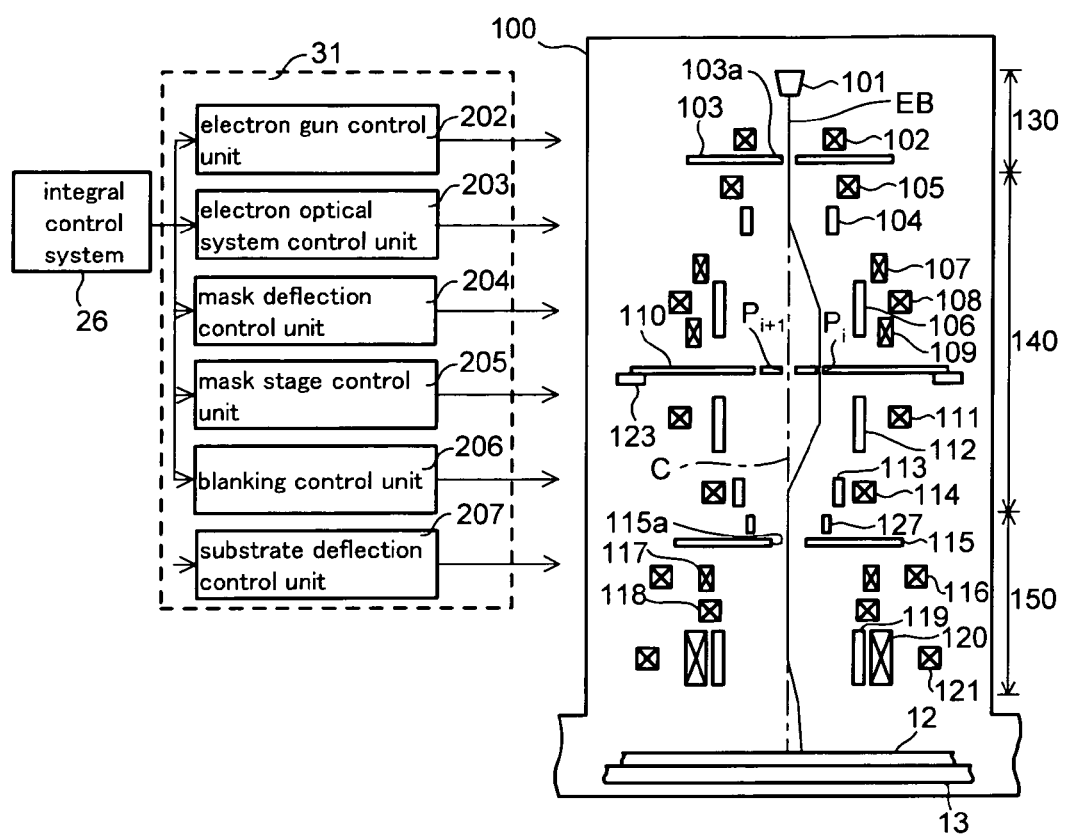
FIG. 2 is a configuration diagram of one of column cells in the exposure device in FIG. 1.

FIG. 2 is a schematic configuration diagram of each column cell 11 used in the multi-column electron beam exposure apparatus.

Each column cell 11 is broadly divided into an exposure unit 100 and a column cell controller 31 to control the exposure unit 100. The exposure unit 100 is formed of an electron beam generation part 130, a mask deflection part 140, and a substrate deflection part 150.

In the electron beam generation part 130, an electron beam EB generated by an electron gun 101 is subjected to the converging action of a first electromagnetic lens 102, and then passes through a square aperture 103a in a beam-shaping mask 103, so that the electron beam EB is formed into a square shape in cross section.

Thereafter, the electron beam EB forms an image on an exposure mask 110 through a second electromagnetic lens 105 in the mask deflection part 140. Then, by first and second electrostatic deflectors 104 and 106, the electron beam EB is deflected to a specific pattern P formed in the exposure mask 110, so that the electron beam EB is formed into the shape of the pattern P in cross section.

Note that the exposure mask 110 is fixed to a mask stage 123 in the electron beam column 10, but this mask stage 123 is movable horizontally. Thus, in a case of using a pattern P existing in a region beyond the deflection range (beam deflection region) of the first and second electromagnetic deflectors 104 and 106, the mask stage 123 is moved to bring the pattern P inside the beam deflection region.

Third and fourth electromagnetic lenses 108 and 111 disposed above and below the exposure mask 110, respectively, are responsible for causing the electron beam EB to form an image on a substrate through the adjustment of the amounts of electric currents therein.

The electron beam EB having passed through the exposure mask 110 is brought back to its optical axis C due to the deflection actions of third and fourth electrostatic deflectors 112 and 113, and then reduced in size by a fifth electromagnetic lens 114.

The mask deflection part 140 is provided with first and second correction coils 107 and 109 which correct the beam deflection aberration produced by the first to fourth electrostatic deflectors 104, 106, 112, and 113.

Then, the electron beam EB passes through an aperture 115a in a shielding plate 115 of the substrate deflection part 150, and is projected onto the substrate by first and second projection electromagnetic lenses 116 and 121. As a result, an image of the pattern in the exposure mask 110 is transferred on the substrate with a predetermined reduction ratio, for example, a reduction ratio of 1/10.

The substrate deflection part 150 is provided with a fifth electrostatic deflector 119 and an electromagnetic deflector 120, which deflect the electron beam EB and allow an image of the pattern of the exposure mask to be projected on a predetermined region of the substrate.

The substrate deflection part 150 is also provided with third and fourth correction coils 117 and 118 to correct the deflection aberration of the electron beam EB on the substrate.

The column cell controller 31 includes an electron gun control unit 202, an electron optical system control unit 203, a mask deflection control unit 204, a mask stage control unit 205, a blanking control unit 206, and a substrate deflection control unit 207. The electron gun control unit 202 controls the electron gun 101 to control the accelerating voltage of the electron beam EB, the beam emitting condition, and the like. In addition, the electron optical system control unit 203 controls the amounts of electric currents and the like into the electromagnetic lenses 102, 105, 108, 111, 114, 116, and 121 to thereby adjust the magnifications, the focal positions, and the like of electron optical systems which these electromagnetic lenses are included in. The blanking control unit 206 controls the voltage to be applied to a blanking electrode 127 so that the electron beam EB generated before the start of exposure is deflected onto the shielding plate 115. Accordingly, the blanking control unit 206 prevents the substrate to be irradiated with the electron beam EB before the exposure.

The substrate deflection control unit 207 controls the voltage to be applied to the fifth electrostatic deflector 119 and the amount of electric current into the electromagnetic deflector 120 so that the electron beam EB is deflected onto a predetermined region of the substrate. The above components 202 to 207 are controlled collectively by the integrated control system 26 such as a workstation.

Figure 3:
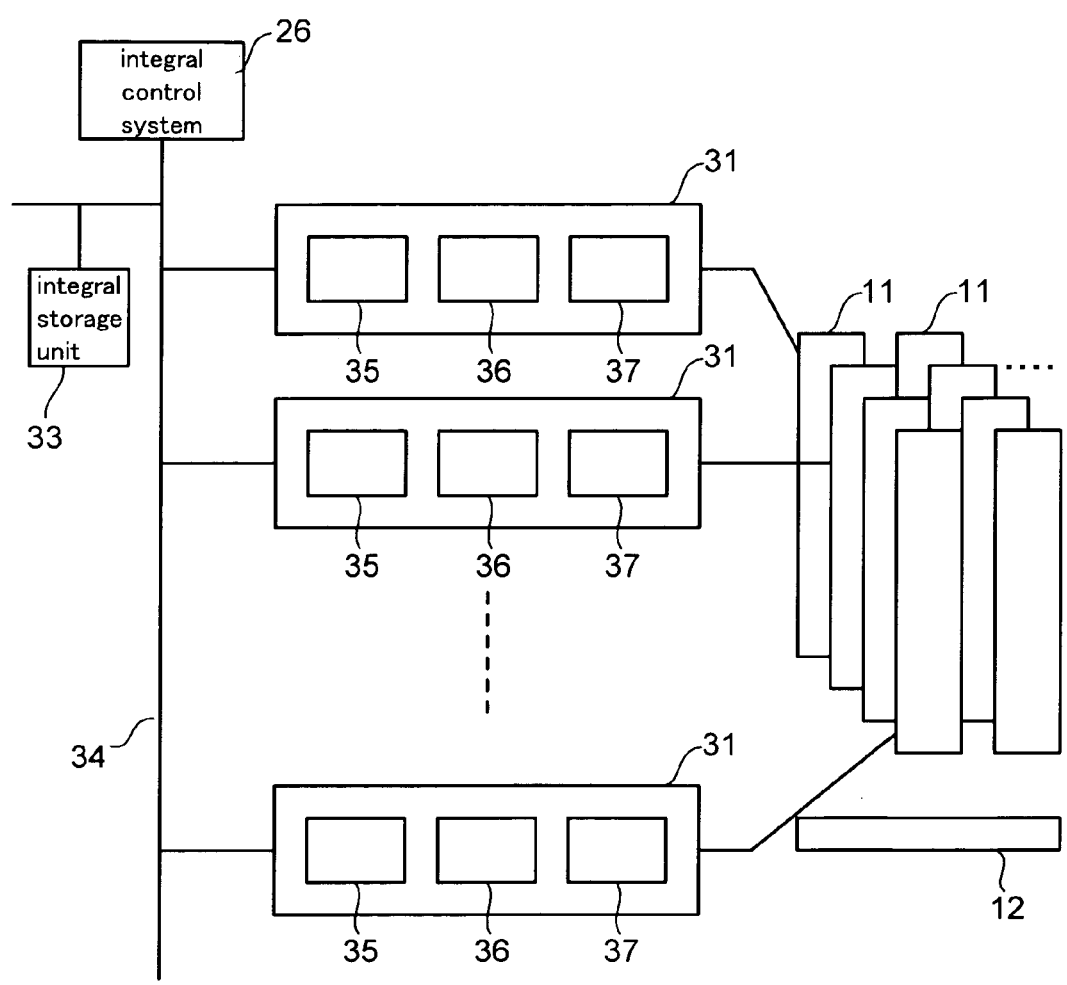
FIG. 3 is a schematic diagram of a column cell controller of the exposure device in FIG. 1.

FIG. 3 is a schematic diagram of each column cell controller 31 in the multi-column electron beam exposure apparatus. The column cell controller 31 is provided to each of the column cells 11. The column cell controllers 31 are connected to the integrated control system 26, which controls the entire multi-column electron beam exposure apparatus, through a bus 34. An integrated storage unit 33 stores therein data necessary for all the column cells, such as data on the exposure. The integrated storage unit 33 is also connected to the integrated control system 26 through the bus 34.

In the multi-column electron beam exposure apparatus having such a configuration, the exposure data containing the pattern with which the exposure is to be performed on the wafer 12 mounted on the wafer stage 13 is transferred from the integrated storage unit 33 to a column cell storage unit 35 of each column cell controller 31. The exposure data thus transferred undergoes correction in a correction unit 36 of the column cell controller 31 and converted in an exposure data converter 37 into data necessary for the actual exposure process. Then, exposure regions on the wafer 12, which are allocated respectively to the column cells 11, are exposed to electron beam of the same pattern.

Configuration of Electron Beam Converging Unit

Next, the lenses (electron beam converging unit) of the multi-column electron beam exposure apparatus will be described.

In electron beam exposure apparatuses, electron optical systems are used to adjust the scale, rotation, focal position, and the like of an image to be projected onto a substrate. Specifically, in each electromagnetic lens, the electric current flowing into its corresponding coil is changed to alter the corresponding magnetic field, and to thereby adjust the focal position, rotation, and scale of the image to desired values.

Figure 4:
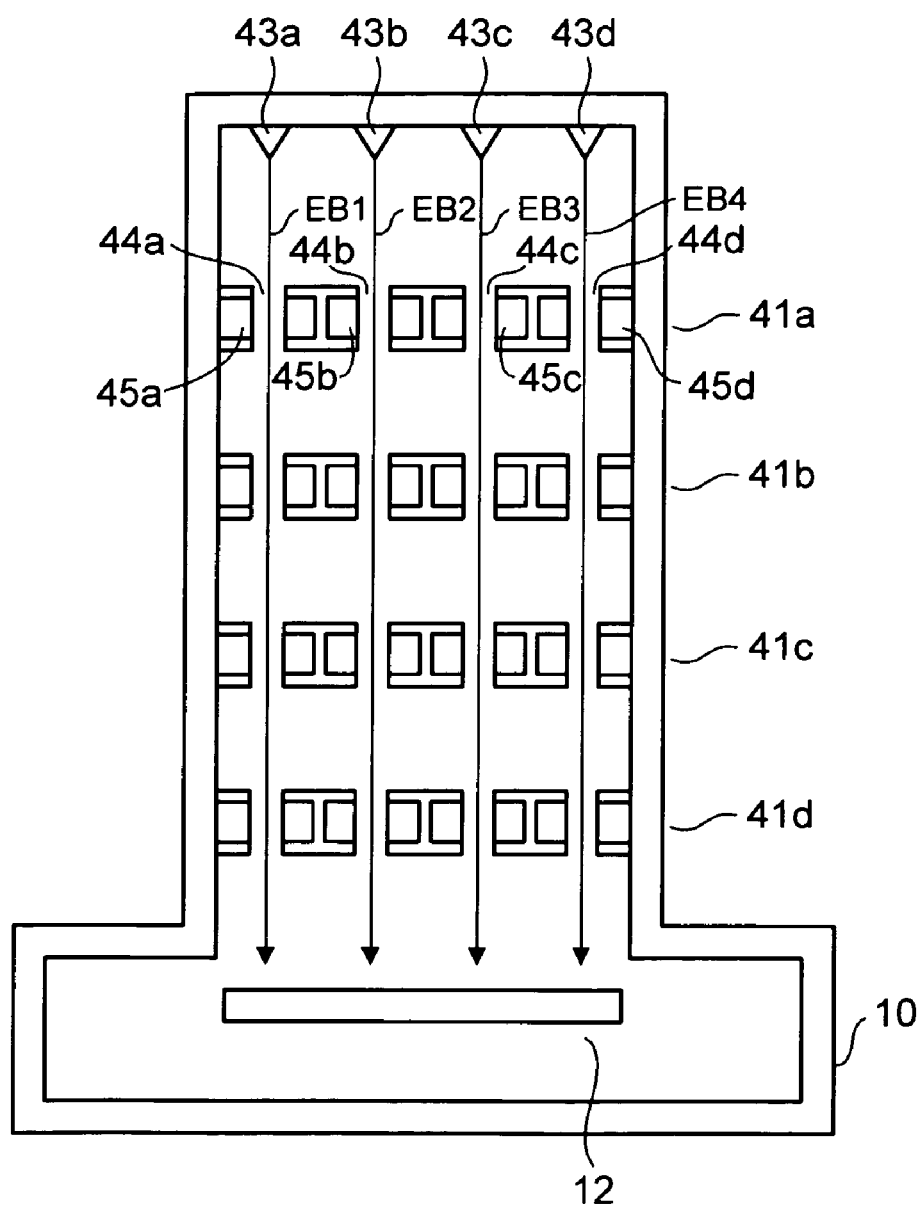
FIG. 4 is a diagram schematically showing electron beam converging units of a multi-column electron beam exposure apparatus.

FIG. 4 is a diagram schematically showing electron beam converging units of a multi-column electron beam exposure apparatus. The device shown in FIG. 4 includes four column cells and exposes a sample 12 to electron beams EB1 to EB4 emitted respectively by electron guns 43a to 43d. Also, the device includes four stages of electron beam converging units 41a to 41d. Each of the electron beam converging units 41a-41d includes a substrate provided with apertures 44a to 44d for the electron beams to pass through, respectively. In the apertures, electron beam converging members 45a and 45d are provided which are mainly made of permanent magnets generating magnetic fields for converging the electron beams EB1 to EB4, respectively.

Figure 5:
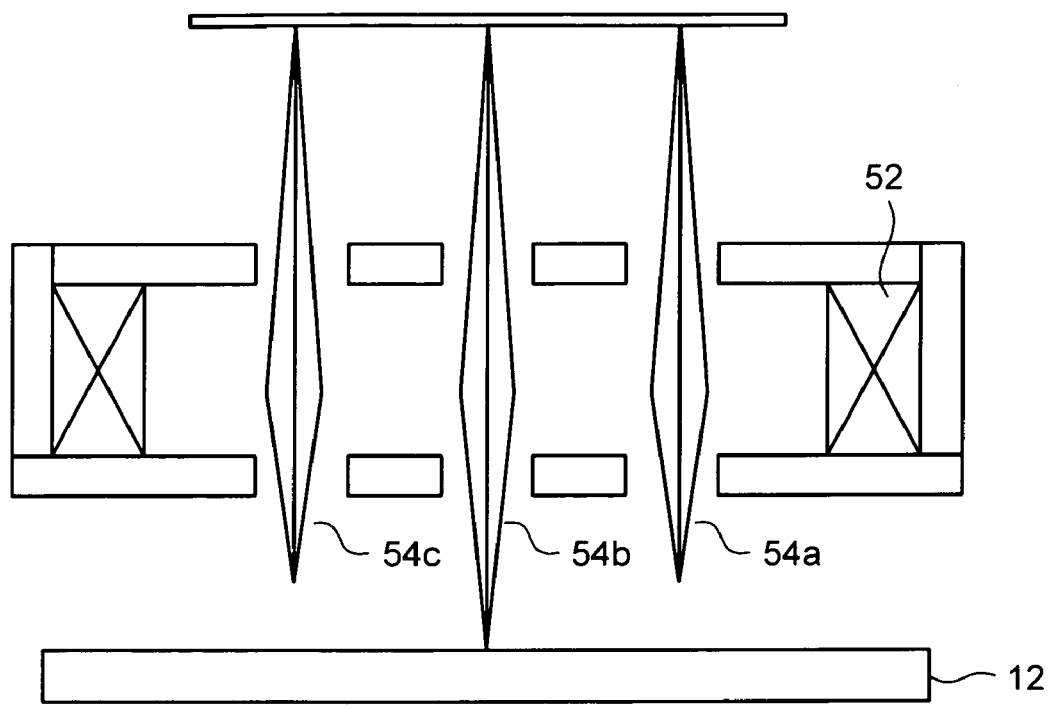
FIG. 5 is a diagram showing a problem related to electromagnetic lenses of the multi-column electron beam exposure apparatus.

FIG. 5 is a diagram showing a problem related to electromagnetic lenses of multi-column electron beam exposure apparatuses. FIG. 5 shows the focal points of electron beams in a case where the electromagnetic lens for each column cell is formed of only a single coil 52 shared by all the column cells of the device. As shown in FIG. 5, it is found through a simulation that when electron beams are emitted under the same condition, the focal length of the electromagnetic lens varies depending on the column cell, as the focal length of the electromagnetic lens for each of the electron beams 54a and 54c in the column cells on both sides is shorter than that for the electron beam 54b in the center column.

Possible causes of this phenomenon are that the coil is wound in the sharing manner and that the magnetic poles of the magnetic fields of multiple column cells are uneven between the magnetic poles of a parallel plate. In this respect, it is possible to provide coils individually to the column cells to thereby make the focal lengths of the electromagnetic lenses of the column cells equal to each other. However, use of coils in such a manner results in an increase in the size of the whole device.

To solve this, the inventors focused on the way of using permanent magnets so as to control the magnetic fields in the column cells without using a common coil, and also to make the whole device compact.

Figure 6A:
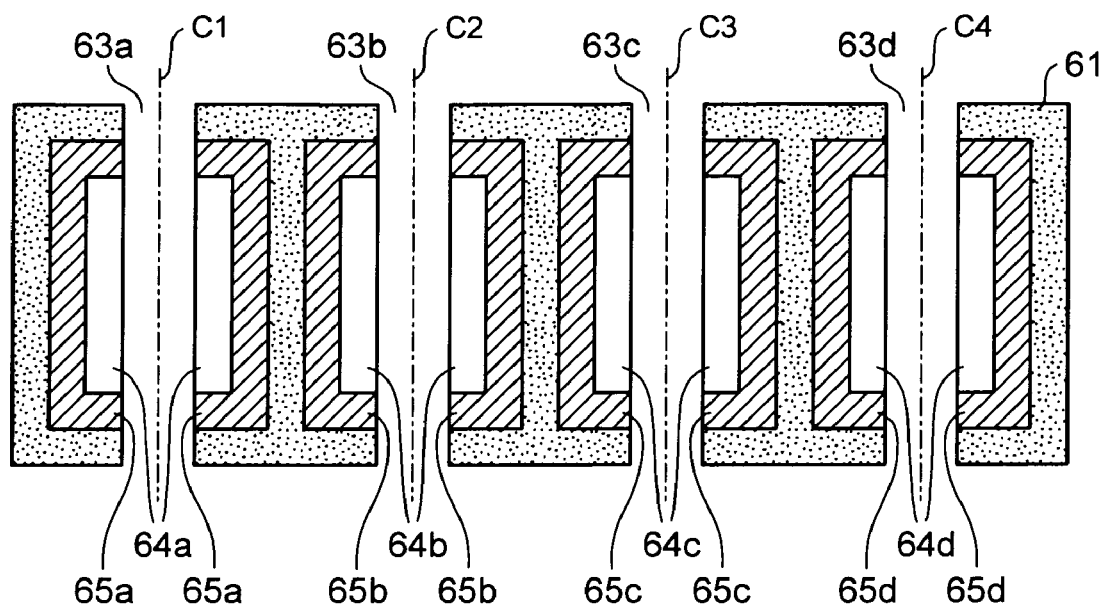
FIGS. 6A and 6B are diagrams schematically showing an overview of an electron beam converging unit at the first stage.
Figure 6B:
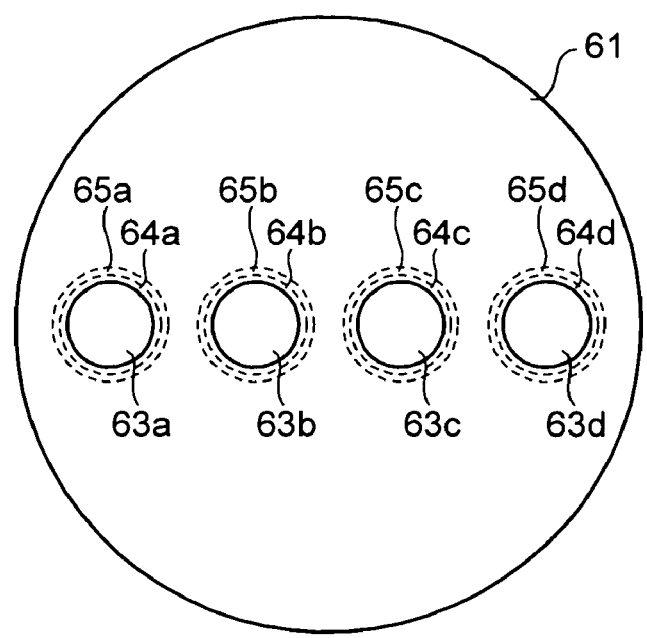

FIGS. 6A and 6B are diagrams schematically showing an overview of the electron beam converging units at the first stage using permanent magnets. FIG. 6A is a cross-sectional view of the electron beam converging units, taken along a line parallel to optical axes C1 to C4. FIG. 6B is a plan view of the electron beam converging units.

As shown in FIGS. 6A and 6B, the electron beam converging units of the multi-column electron beam exposure apparatus include a substrate 61 provided with apertures (circular holes) 63a to 63d for the electron beams EB1 to EB4 to pass through, respectively. In each of side portions 64a to 64d of the respective apertures 63a and 63d, there are provided a permanent magnet for generating a magnetic field to converge the corresponding one of the electron beams EB1 to EB4 and an electromagnetic coil for correction. In addition, the sets of the permanent magnet and the correction electromagnetic coil are provided with ferromagnetic frames 65a to 65d that surround them, respectively.

The substrate 61 as above is disposed at a position where lenses to converge the electron beams are constructed. Each of the permanent magnets disposed in the side portions of the apertures is an annular permanent magnet magnetized in the direction of the optical axis and being symmetrical about the optical axis. Near the permanent magnet, the electromagnetic coil is disposed for adjusting the magnetic field generated by the permanent magnet.

In the following, configurations of each electron beam converging unit will be described in detail by using FIGS. 7A to 9B.

Example 1 of Configuration of Electron Beam Converging Unit

Figure 7A:
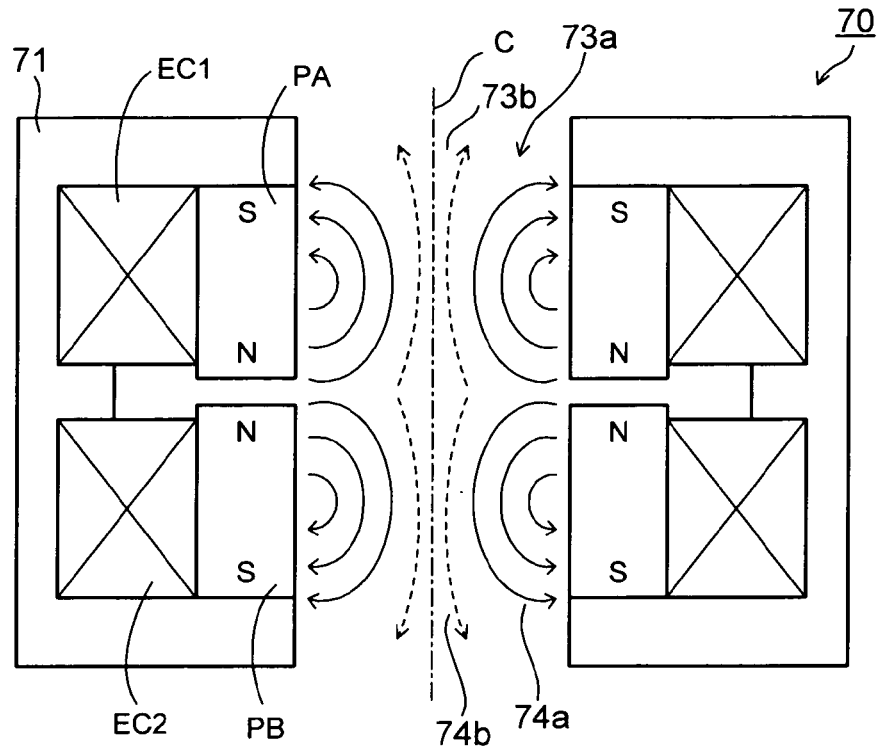
FIGS. 7A and 7B are diagrams schematically showing the electron beam converging unit (first example).
Figure 7B:
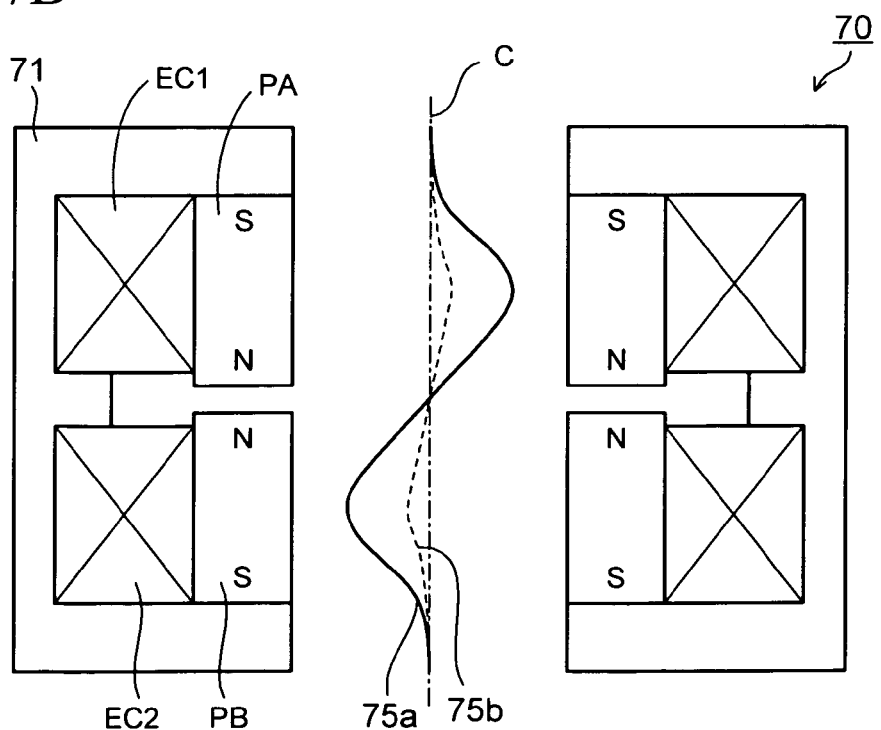

FIGS. 7A and 7B are cross-sectional views of an electron beam converging unit 70, taken along a line extending along and being parallel to the optical axis C of the electron beam converging unit 70. FIG. 7A shows magnetic fields with magnetic field lines, and FIG. 7B shows the strength of the magnetic fields.

As shown in FIGS. 7A and 7B, the electron beam converging unit 70 is formed of a ferromagnetic frame 71 made of pure iron or the like, and permanent magnets PA and PB and electromagnetic coils EC1 and EC2 all surrounded by the ferromagnetic frame 71. The permanent magnets PA and PB are two permanent magnets each formed in a ring shape (annular shape) and magnetized in the Z-axis (optical axis C) direction. These two permanent magnets PA and PB are disposed one above the other with their same polarities facing each other. The two permanent magnets PA and PB are so disposed as to allow a gap therebetween as small as possible. A gap is also provided between each of the permanent magnets PA and PB and the ferromagnetic frame 71 (in a direction perpendicular to the Z-axis direction). In the gaps, the electromagnetic coils EC1 and EC2 are disposed, respectively. The electromagnetic coils EC1 and EC2 are wound in mutually opposite directions.

For the permanent magnets PA and PB, a rare-earth magnet such as a neodymium magnet ($Nd_2Fe_{14}B$) or a samarium-cobalt magnet ($SmCo_5$, $Sm_2Co_{17}$) is used. Such a rare-earth magnet is high in maximum energy product, and thus a small portion thereof can provide a large magnetic force, as compared to a ferrite magnet or an alnico magnet. In particular, the neodymium magnet is a sinter mainly containing iron and boron. Hence, the neodymium magnet is high in remanent magnetic flux density and coercivity and exerts a high magnetic energy. In addition, the neodymium magnet is high in mechanical strength. Thus, the permanent magnets PA and PB can be made small.

In the electron beam converging unit 70 configured as above, a magnetic field is generated in each of the two permanent magnets PA and PB as shown in FIG. 7A. Specifically, a magnetic field 73a is generated in a direction from the north pole of the upper permanent magnet PA to the south pole thereof above the north pole; and another magnetic field 74a is generated in a direction from the north pole of the lower permanent magnet PB to the south pole thereof below the north pole. Meanwhile, broken lines 73b and 74b in FIG. 7A represent magnetic fields generated by supplying electric currents to the electromagnetic coils EC1 and EC2, respectively. As shown in FIG. 7A, the magnetic field 73b of the electromagnetic coil EC1 is generated at a position where it interferes with the magnetic field 73a of the permanent magnet PA, and the magnetic field 74b of the electromagnetic coil EC2 is generated at a position where it interferes with the magnetic field 74a of the permanent magnet PB.

A solid line 75a along the optical axis C in FIG. 7B represents the strength of the magnetic fields 73a and 74a formed along the optical axis C by the respective permanent magnets PA and PB. The magnetic field strength is illustrated while assuming the direction of the magnetic field generated by the permanent magnet PA as a positive direction. As shown in FIG. 7B, the magnetic field of the permanent magnet PA reaches the maximum strength at a center portion of the permanent magnet PA in the direction of the optical axis C, whereas the magnetic field of the permanent magnet PB reaches the maximum strength in the negative direction at a center portion of the permanent magnet PB in the direction of the optical axis C.

Each of the permanent magnets PA and PB is magnetized through such adjustment that it can obtain a magnetic field strength required as a lens. However, the permanent magnet after being magnetized has constant magnetic field strength, and the focal point thereof cannot be adjusted. Thus, the electromagnetic coil is used to make adjustment for deficiency or excess of the required magnetic field strength. The magnetic field strength of the permanent magnet to be increased or decreased through the adjustment by the electromagnetic coil is approximately 5%. For this reason, approximately 100 AT is large enough for the electromagnetic coil for such use. Accordingly, the electromagnetic coil does not need to be made large and can be disposed in the gap shown in FIGS. 7A and 7B. A broken line 75b along the optical axis C in FIG. 7B represents the strength of the magnetic fields of the electromagnetic coils EC1 and EC2. Through the adjustment of electric currents to be supplied to the electromagnetic coils EC1 and EC2, the strength of the magnetic fields of the permanent magnets PA and PB can be corrected and adjusted to required magnetic field strength.

Incidentally, the inventors found through a simulation that, in the case where the permanent magnets PA and PB are disposed as shown in FIGS. 7A and 7B with the amount of magnetization of each neodymium magnet 10000 G, magnetic fields of 1000 G can be formed on the optical axis and a lens with a focal length of 30 mm can be formed.

Example 2 of Configuration of Electron Beam Converging Unit

Figure 8A:
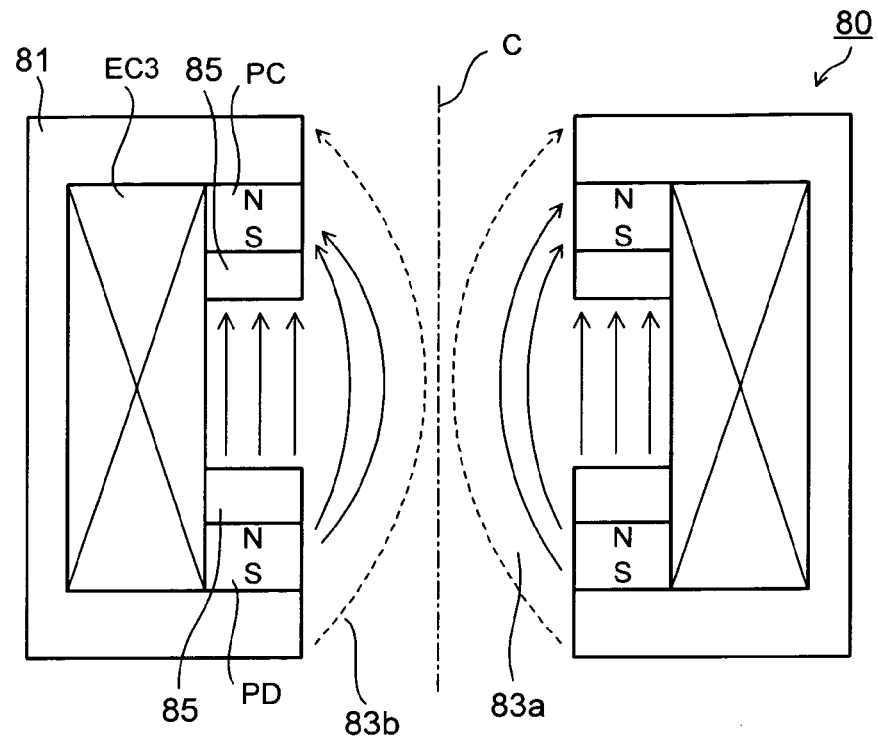
FIGS. 8A and 8B are diagrams schematically showing the electron beam converging unit (second example).
Figure 8B:
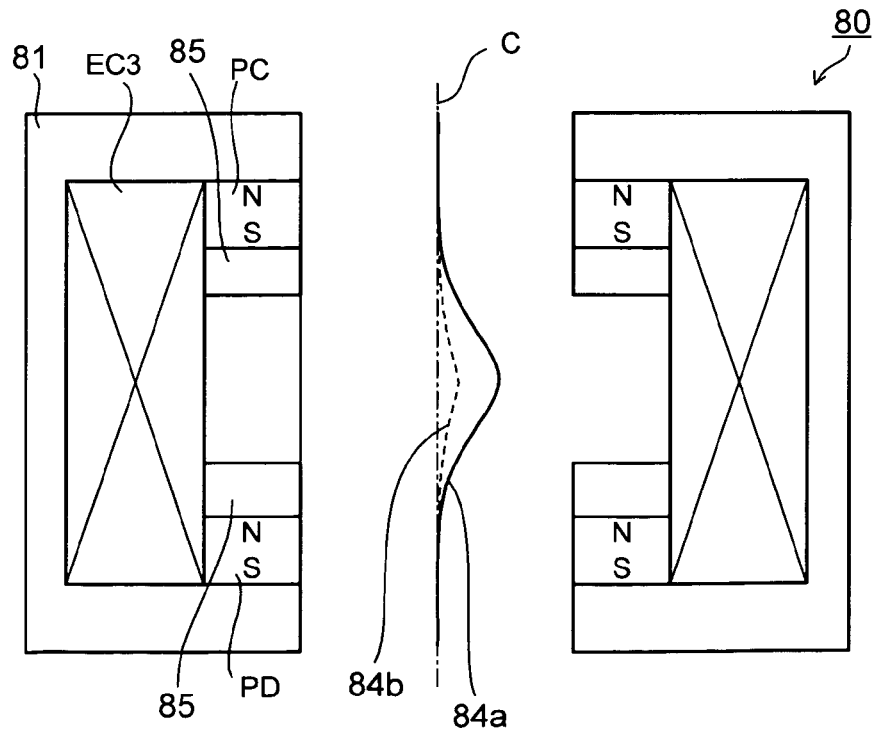

FIGS. 8A and 8B show another example of a configuration of each electron beam converging unit. FIGS. 8A and 8B are cross-sectional views of an electron beam converging unit 80, taken along a line extending along and being parallel to the optical axis C of the electron beam converging unit 80. FIG. 8A shows magnetic fields with magnetic field lines, and FIG. 8B shows the strength of the magnetic fields.

Two permanent magnets are used in the electron beam converging unit 80 shown in FIGS. 8A and 8B as in the case of the electron beam converging unit 70 shown in FIGS. 7A and 7B, but the arrangement of the magnets is different.

Permanent magnets PC and PD each formed in a ring shape (annular shape) are magnetized in the Z-axis (optical axis C) direction. These two permanent magnets PC and PD are arranged in such a manner that the polarities thereof are oriented in the same direction. A gap is provided between the permanent magnets PC and PD. The permanent magnets PC and PD are surrounded by a ferromagnetic frame 81, and a gap is also provided between each of the permanent magnets PC and PD and the ferromagnetic frame 81 in the radial direction of the ferromagnetic frame 81 (in a direction perpendicular to the direction of the optical axis C). In the gap, an electromagnetic coil EC3 is disposed. In addition, the permanent magnets PC and PD are provided respectively with yokes 85 on sides thereof where they face each other.

Like the permanent magnets PA and PB shown in FIGS. 7A and 7B, a rare-earth magnet, such as a neodymium magnet or a samarium-cobalt magnet, is used for the permanent magnets PC and PD.

In the electron beam converging unit 80 configured as above, a magnetic field is generated across the two permanent magnets PC and PD as shown in FIG. 8A. Specifically, a magnetic field 83a is generated in a direction from the north pole of the lower permanent magnet PD to the south pole of the upper permanent magnet PC. Meanwhile, broken lines in FIG. 8A represent a magnetic field 83b generated by supplying an electric current to the electromagnetic coil EC3. As shown in FIG. 8A, the magnetic field 83b of the electromagnetic coil EC3 is generated at a position where it interferes with the magnetic field 83a of the permanent magnets PC and PD.

A solid line 84a along the optical axis C in FIG. 8B represents the strength of the magnetic field 83a formed along the optical axis C by the permanent magnets PC and PD. As shown in FIG. 8B, the magnetic field 83a reaches the maximum strength at a center portion of the gap portion between the permanent magnets PC and PD.

Each of the permanent magnets PC and PD is magnetized through such adjustment that it can obtain a magnetic field strength required as a lens. However, since the permanent magnet after being magnetized has a constant magnetic field strength, the focal point thereof cannot be adjusted. Thus, the electromagnetic coil is used to correct deficiency or excess of the required magnetic field strength. Approximately 100 AT is large enough for the electromagnetic coil for such use. Accordingly, the electromagnetic coil can be small and disposed in the gap between the ferromagnetic frame 81 and the permanent magnets PC and PD, as shown in FIGS. 8A and 8B. A broken line 84b along the optical axis C in FIG. 8B represents the strength of the magnetic field of the electromagnetic coil EC3. Through the adjustment of the amount of an electric current to be supplied to the electromagnetic coil EC3, the strength of the magnetic field of the permanent magnets PC and PD can be corrected and adjusted to required magnetic field strength.

Incidentally, the inventors found through a simulation that, in the case where the permanent magnets PC and PD are disposed as shown in FIGS. 8A and 8B with the amount of magnetization of each neodymium magnet 10000 G, a magnetic field of 500 G is formed on the optical axis. The electron beam converging unit with this configuration has magnetic field strength lower than that of the electron beam converging unit 70 configured as shown in FIGS. 7A and 7B but still high enough to converge the electron beam, unless used for an objective lens.

The electromagnetic coil EC3 for correction is disposed between the ferromagnetic frame 81 and the permanent magnets PC and PD to surround the permanent magnets PC and PD in the case of FIGS. 8A and 8B. However, the arrangement can be reversed. Specifically, the correction electromagnetic coil EC3 may be provided inward of the permanent magnets PC and PD. The electron beam converging unit with this configuration also allows the magnetic field of the correction electromagnetic coil EC3 to interfere with the magnetic field of the permanent magnets PC and PD, thereby adjusting the magnetic field of the permanent magnets PC and PD to a required magnetic field.

Example 3 of Configuration of Electron Beam Converging Unit

Figure 9A:
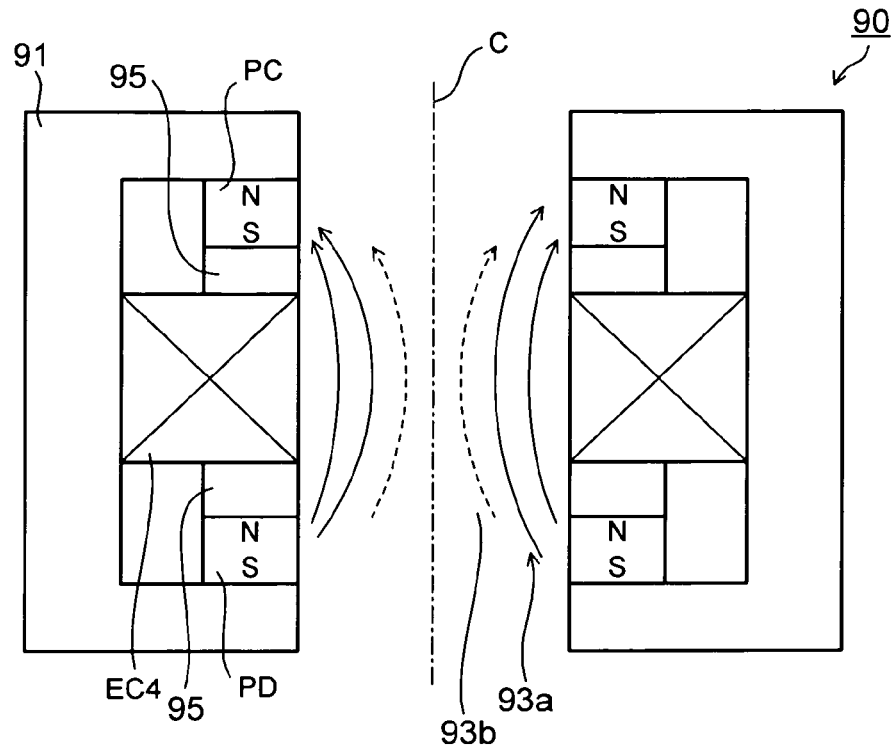
FIGS. 9A and 9B are diagrams schematically showing the electron beam converging unit (third example).
Figure 9B:
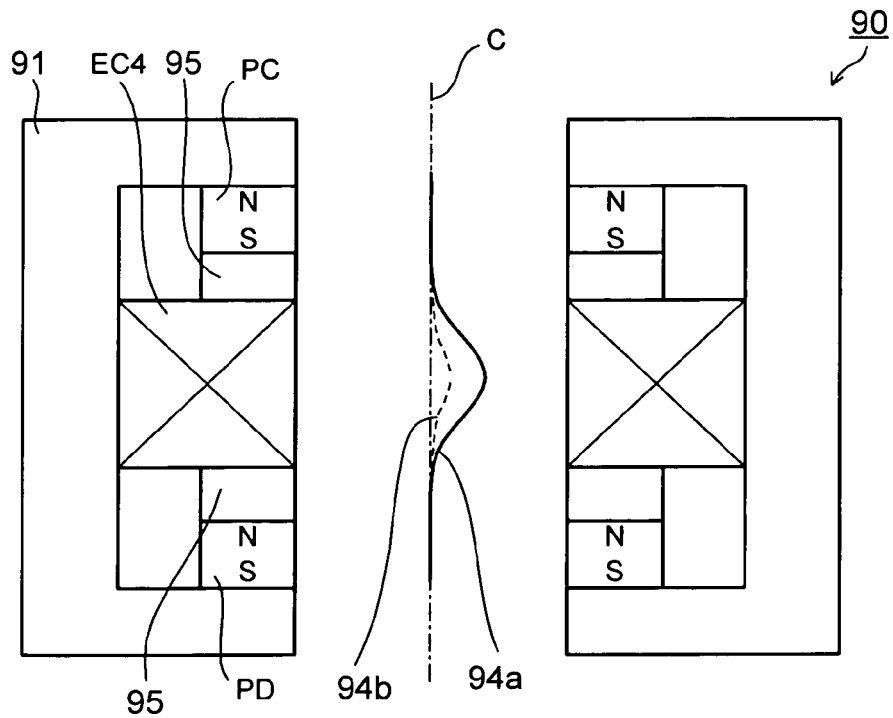

FIGS. 9A and 9B show still another example of a configuration of each electron beam converging unit. FIGS. 9A and 9B are cross-sectional views of an electron beam converging unit 90, taken along a line extending along and being parallel to the optical axis C of the electron beam converging unit 90. FIG. 9A shows magnetic fields with magnetic field lines, and FIG. 9B shows the strength of the magnetic fields.

Two permanent magnets and one electromagnetic coil for correction are used in the electron beam converging unit 90 shown in FIGS. 9A and 9B as in the case of the electron beam converging unit 80 shown in FIGS. 8A and 8B, but the arrangement of the correction electromagnetic coil is different.

The permanent magnets PC and PD each formed in a ring shape (annular shape) are magnetized in the Z-axis (optical axis C) direction. These two permanent magnets PC and PD are arranged in such a manner that the polarities thereof are oriented in the same direction. A gap is provided between the permanent magnets PC and PD. In the gap, an electromagnetic coil EC4 is disposed. Like the permanent magnets shown in FIGS. 8A and 8B, a rare-earth magnet, such as a neodymium magnet or a samarium-cobalt magnet, is used for the permanent magnets PC and PD. In addition, the permanent magnets PC and PD are provided respectively with yokes 95 on sides thereof where they face each other.

In the electron beam converging unit 90 configured as above, a magnetic field is generated across the two permanent magnets PC and PD as shown in FIG. 9A. Specifically, a magnetic field 93a is generated in a direction from the north pole of the lower permanent magnet PD to the south pole of the upper permanent magnet PC. Meanwhile, broken lines in FIG. 9A represent a magnetic field 93b generated by supplying an electric current to the electromagnetic coil EC4. As shown in FIG. 9A, the magnetic field 93b of the electromagnetic coil EC4 is generated at a position where it interferes with the magnetic field 93a of the permanent magnets PC and PD.

A solid line 94a along the optical axis C in FIG. 9B represents the strength of the magnetic field 93a formed along the optical axis C by the permanent magnets PC and PD. As shown in FIG. 9B, the magnetic field 93a reaches the maximum strength at a center portion of the gap portion between the permanent magnets PC and PD. A broken line 94b along the optical axis C in FIG. 9B represents the strength of the magnetic field of the electromagnetic coil EC4. Through the adjustment of the amount of an electric current to be supplied to the electromagnetic coil EC4, the strength of the magnetic field of the permanent magnets PC and PD can be corrected and adjusted to a required magnetic field strength.

Incidentally, the inventors found through a simulation that, in the case where the permanent magnets PC and PD are disposed as shown in FIGS. 9A and 9B with the amount of magnetization of each neodymium magnet 10000 G, a magnetic field of 500 G is formed on the optical axis. The electron beam converging unit with this configuration has magnetic field strength lower than that of the electron beam converging unit 70 configured as shown in FIGS. 7A and 7B but still high enough to converge the electron beam, unless used for an objective lens.

The electron beam converging units described above are placed in the lenses provided to the multi-column electron beam exposure apparatus. For the adjustment of each correction coil to be used there, a simulation of electron beam emission is performed to determine the amount of electric current to be supplied to the correction coil so that the electron beam of the corresponding column would be converged on the corresponding optical axis.

Note that the electron beam converging unit as shown in FIGS. 7A and 7B (the configuration where the same polarities of the permanent magnets face each other) may be used for an objective lens at a stage immediately before the electron beam is incident on the sample, and the electron beam converging units as shown in FIGS. 8A and 8B and/or 9A and 9B (the configuration where the polarities of the two permanent magnets are oriented in the same direction and a gap is given between the magnets) may be used for the other lenses.

As has been described above, the multi-column electron beam exposure apparatus of this embodiment uses permanent magnets for the generation of magnetic fields to converge an electron beam in each column cell. As permanent magnets having magnetic field strength high enough to converge the electron beam, a neodymium magnet is used, for example. Use of such a permanent magnet allows reduction in the size of the magnetic field generation unit, whereby the intervals between the column cells can be reduced to 25 mm or smaller, for example. As a result, many column cells can be used within an area of 150 mm$^2$ or smaller, and the throughput can be improved.

In addition, each permanent magnet is surrounded by the frame made of a ferromagnetic material such as pure iron. This makes it possible to prevent one column cell from affecting the magnetic fields of the lenses in other adjacent column cells. Accordingly, the accuracy of the exposure by each column cell can be secured. Since the magnetic field strength of the permanent magnet is constant and therefore fine adjustment of the magnetic field strength cannot be made for the adjustment of the focal point. In this regard, the electromagnetic coil is provided near each permanent magnet to cause interference between its magnetic field and that of the permanent magnet. Accordingly, the magnetic field strength of the permanent magnet is adjusted.

Note that each of the electron beam converging units described in FIGS. 7A to 9B can be used alone as a magnetic field generation device. In other words, the electron beam converging unit can be employed as an electron beam converging unit of a single-column electron beam exposure apparatus, as well as that of a multi-column electron beam exposure apparatus.

In the case of such a magnetic field generation device, magnetic fields are generated by using rare-earth permanent magnets such as neodymium magnets or samarium-cobalt magnets. These permanent magnets are two annular permanent magnets magnetized in a direction perpendicular to the radial direction thereof and used to generate magnetic fields. In particular, by disposing the permanent magnets with their magnetization directions being opposite to each other, the magnetic field strength can be made high, whereby a strong magnetic field can be generated in a small space.

In addition, each permanent magnet is surrounded by the frame made of a ferromagnetic material such as pure iron. This makes it possible to prevent a generated magnetic field from leaking to the outside. Moreover, an electromagnetic coil is provided near each permanent magnet, and therefore, the magnetic field strength of the permanent magnet can be adjusted by use of the magnetic field of the electromagnetic coil.

The invention claimed is:

1. A multi-column electron beam exposure apparatus comprising:
   a plurality of column cells;
   an electron beam converging unit in which two annular permanent magnets and an electromagnetic coil are surrounded by a ferromagnetic frame, each of the two annular permanent magnets being magnetized in a direction of an optical axis and being symmetrical about the optical axis, the electromagnetic coil being disposed near the annular permanent magnets and used to adjust a magnetic field of the annular permanent magnets;
   a substrate provided with circular apertures through which electron beams used in the column cells pass, respectively, the substrate having the electron beam converging unit disposed in a side portion of each of the circular apertures;
   two annular permanent magnets are disposed one above the other in the direction of the optical axis with the electromagnetic coil directly interposed therebetween, and polarities of the annular permanent magnets are oriented in a same direction; and
   wherein strength of the magnetic field of the annular permanent magnets is within a range from 5% lower to 5% higher than required magnetic field strength.

2. The multi-column electron beam exposure apparatus according to claim 1, wherein
   each of the annular permanent magnets is any one of a neodymium magnet and a samarium-cobalt magnet, and the ferromagnetic frame is made of pure iron.

3. A magnetic field generation device comprising:
   two annular permanent magnets magnetized in a direction perpendicular to a radial direction thereof and disposed one above the other;
   an electromagnetic coil disposed near the annular permanent magnets and used to adjust a magnetic field of the annular permanent magnets; and
   a ferromagnetic frame surrounding the annular permanent magnets and the electromagnetic coil;
   the electromagnetic coil is disposed directly between the two annular permanent magnets, and
   polarities of the annular permanent magnets are oriented in a same direction;
   wherein strength of the magnetic field of the annular permanent magnets is within a range from 5% lower to 5% higher than required magnetic field strength.

4. The magnetic field generation device according to claim 3, wherein
   each of the annular permanent magnets is any one of a neodymium magnet and a samarium-cobalt magnet, and the ferromagnetic frame is made of pure iron.

* * * * *